(12) United States Patent
Kang et al.

(10) Patent No.: US 8,047,269 B2
(45) Date of Patent: Nov. 1, 2011

(54) THERMAL SPREADER FOR SIMULTANEOUSLY ENHANCING CAPILLARY EFFECT AND STRUCTURAL STRENGTH

(75) Inventors: Shung-Wen Kang, Taipei (TW); Meng-Chang Tsai, Pa-Teh (TW)

(73) Assignee: Tamkang University, Tamsui (TW)

( * ) Notice: Subject to any disclaimer, the term of this patent is extended or adjusted under 35 U.S.C. 154(b) by 917 days.

(21) Appl. No.: 12/072,547

(22) Filed: Feb. 28, 2008

(65) Prior Publication Data

US 2009/0071635 A1    Mar. 19, 2009

(30) Foreign Application Priority Data

Sep. 13, 2007   (TW) ................. 96134236 A

(51) Int. Cl.
    *F28D 15/00* (2006.01)
(52) U.S. Cl. .................... 165/104.26; 165/185
(58) Field of Classification Search ............. 165/104.26, 165/104.33, 104.21, 185, 80.2, 80.4, 80.5
    See application file for complete search history.

(56) References Cited

U.S. PATENT DOCUMENTS

| | | | |
|---|---|---|---|
| 6,889,756 B1 * | 5/2005 | Hou ................... | 165/104.33 |
| 7,447,029 B2 * | 11/2008 | Lai et al. ............ | 361/700 |
| 2002/0179284 A1 * | 12/2002 | Joshi et al. ......... | 165/80.3 |

* cited by examiner

*Primary Examiner* — Teresa Walberg

(57) ABSTRACT

A thermal spreader comprises: a casing having a first side contacted with a heat source and a second side secured with a heat sink, and having a vapor chamber defined in an interior in the casing; and a crosslinking capillary lattice retained in the casing and occupying the vapor chamber in the casing, whereby upon evacuation to form vacuum in the vapor chamber and filling of a vaporizable working fluid in the vapor chamber, the working fluid will be repeatedly vaporized and condensed through the crosslinking capillary lattice to absorb and remove heat from the first side of the casing and to dissipate heat outwardly from the second side of the casing.

5 Claims, 5 Drawing Sheets

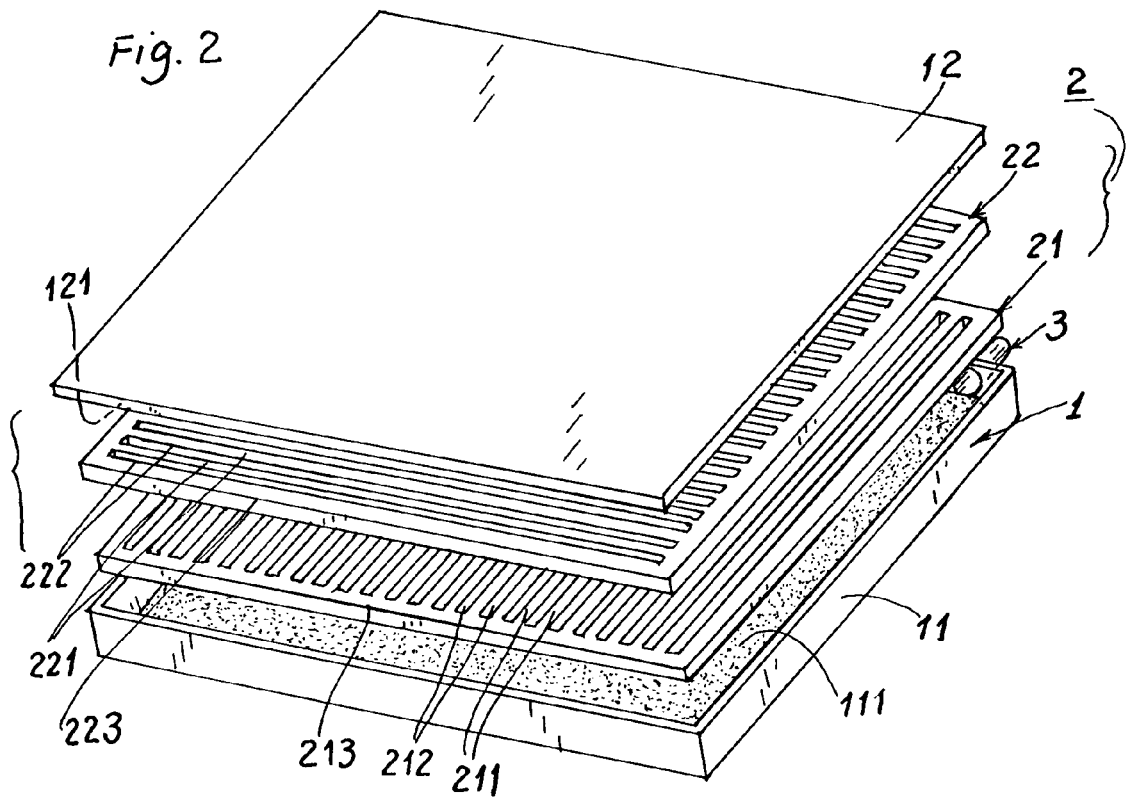
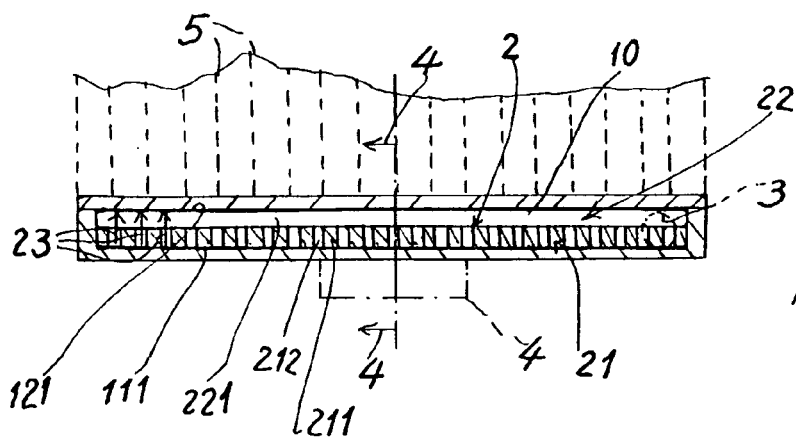
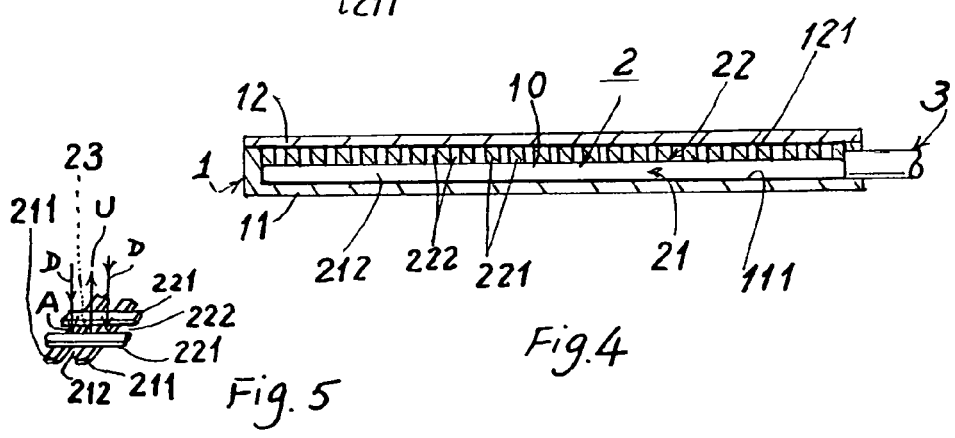

THERMAL SPREADER FOR SIMULTANEOUSLY ENHANCING CAPILLARY EFFECT AND STRUCTURAL STRENGTH

BACKGROUND OF THE INVENTION

Thermal management plays an important role for electronic products. Poor transfer of heat away from an electronic or computer product may result in deterioration of performance and reliability of the product if a high operating temperature is caused unacceptably.

There are many conventional ways provided for solving the thermal management solutions, such as: heat sinks, fans, thermal spreaders, and heat pipes, adapted for dissipating heat outwardly from the electronic, semiconductor or computer products.

A prior art of vapor chamber V as shown in FIG. 1 was disclosed for cooling a heat source C (such as a CPU, semiconductor or other electronic products). A heat sink H is secured to an upper portion of the vapor chamber V for heat dissipation. The vapor chamber V is evacuated to be a vacuum chamber having vaporizable working fluid filled into the chamber and having a wick lining formed on an inside wall of the chamber V. The heat as transferred from the heat source C may vaporize the working fluid. When the vapor contacts with the cooler wall surface, it condenses by releasing the latent heat, which will be outwardly dissipated by the heat sink H. The condensed fluid then returns to the chamber bottom ready to be vaporized for repeating another cycle, thereby dissipating the heat.

However, such a prior art as shown in FIG. 1 has the following drawbacks:

1. Besides the side walls disposed in the vapor chamber V, it is lacking of supporting structure within the vapor chamber V to thereby weaken its structural stability.
2. Partial vapor condensate drops will gravitationally descend to collide with the uprising vaporized working fluid within such a big void chamber, thereby obstructing the operation for repeating the vaporization and condensation cycles and reducing the heat dissipation efficiency.
3. Even the structural strength may be enhanced by thickening the side walls of the vapor chamber, it however may increase the total weight or volume of the electronic product, thereby possibly limiting the manufacture of a compact or sophisticated electronic device.

The present inventor has found the drawbacks of the prior art and invented the present heat spreader with enhanced capillary effect and structural strength.

SUMMARY OF THE INVENTION

The object of the present invention is to provide a thermal spreader comprising: a casing having a first side contacted with a heat source and a second side secured with a heat sink, and having a vapor chamber defined in an interior in the casing; and a crosslinking capillary lattice retained in the casing and occupying the vapor chamber in the casing, whereby upon evacuation to form vacuum in the vapor chamber and filling of a vaporizable working fluid in the vapor chamber, the working fluid will be repeatedly vaporized and condensed through the crosslinking capillary lattice to absorb and remove heat from the first side of the casing and to dissipate heat outwardly from the second side of the casing.

BRIEF DESCRIPTION OF THE DRAWINGS

FIG. 2 is an exploded view showing the elements of the present invention.
FIG. 3 is a sectional drawing of the present invention as assembled from FIG. 2.
FIG. 4 is a sectional drawing as viewed from 4-4 direction of FIG. 3.
FIG. 5 is an illustration showing a capillary opening defined among grid strips of the present invention.

DETAILED DESCRIPTION

Figure 1:
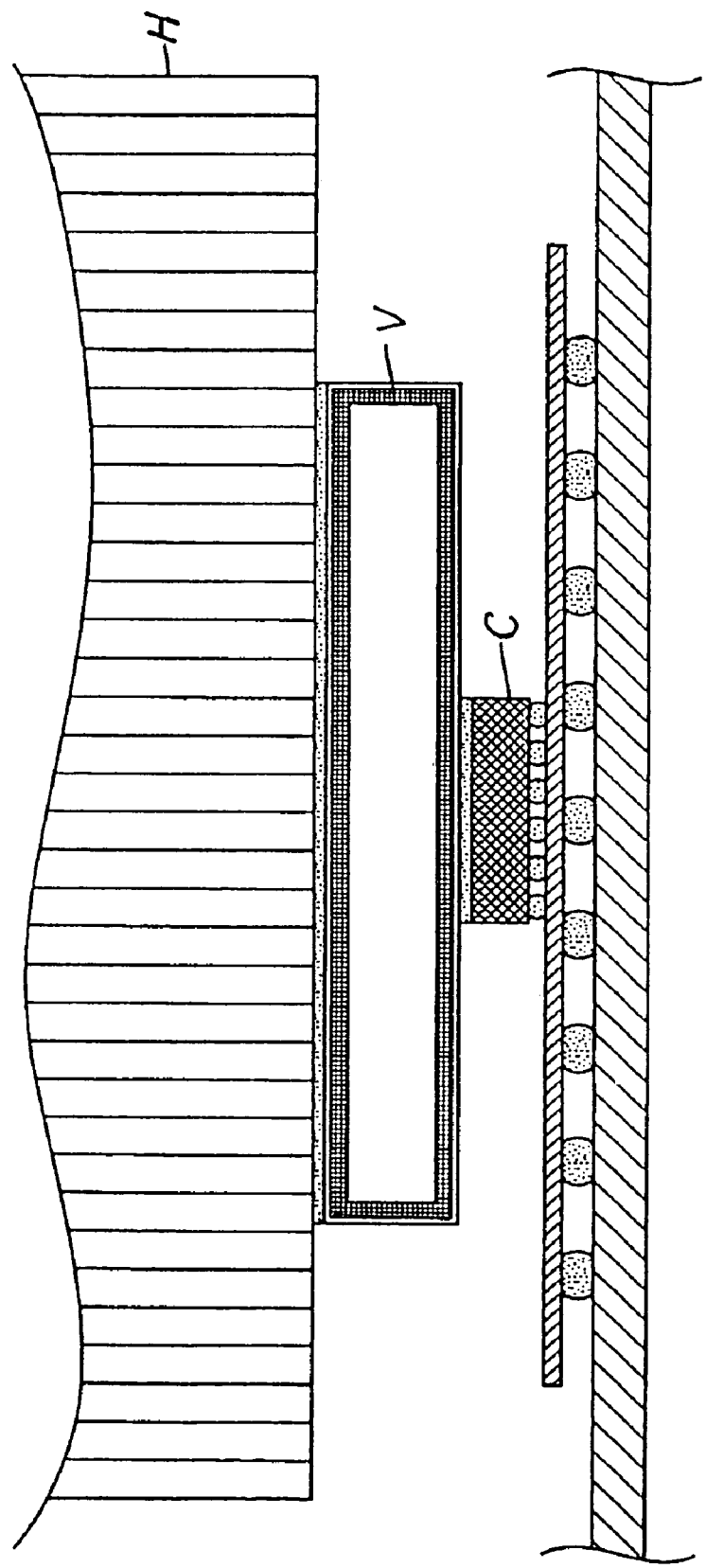
FIG. 1 shows a conventional vapor chamber.

As shown in FIGS. 2~5, a preferred embodiment of the thermal spreader of the present invention comprises: a casing 1 defining a vapor chamber 10 in an interior in the casing 1; and a crosslinking capillary lattice 2 formed or embedded in the vapor chamber 10 in the casing 1. The vapor chamber 10 is evacuated to form vacuum and then filled with a vaporizable working fluid in the chamber 10, through an adaptor 3 secured to the casing 1 and fluidically communicated with the chamber 10.

The casing 1 may be made of heat conductive metal materials, and includes: a first cover 11, which may be contacted with a heat source 4, such as: a CPU, or other electronic devices capable of producing heat during their operation; and a second cover 12 combined with the first cover 11 to define the vapor chamber 10 in between the first cover 11 and the second cover 12. The second cover 12 may be secured with a heat sink or heat dissipating device 5 thereon as shown in FIG. 3.

Each of the first and second covers 11, 12 includes: a capillary thin layer 111 or 121 fixed, welded or adhered to an inside wall of the cover 11 or 12 to be fluidically communicated with the crosslinking capillary lattice 2 in the casing 1. The capillary thin layer 111 or 121 may be made of: metal network, sintering film, powder metallurgy layer or any other capillary materials.

The materials, shapes or sizes of the elements of the present invention are not limited. A parallelipiped shape of the casing 1 is preferred in this invention.

The crosslinking capillary lattice 2 includes: a lower longitudinal grid 21 closely contacted with the first cover 11, and an upper latitudinal grid 22 superimposed on the lower longitudinal grid 21 and closely contacted with the second cover 12; with the two grids 21, 22 occupying the vapor chamber 10 in the casing 1 and respectively contacted with a lower and an upper capillary thin layer 111, 121 respectively formed in the first and second covers 11, 12.

The lower longitudinal grid 21, as superimposed under the upper latitudinal grid 22, includes: a plurality of lower longitudinal strips 211 juxtapositionally formed in a lower frame 213, with every two neighboring lower longitudinal strips 211 defining a lower longitudinal capillary slit 212 between the two lower longitudinal strips 211 to be fluidically communicated with the lower capillary thin layer 111 formed in the first cover 11.

The upper latitudinal grid 22 includes: a plurality of upper latitudinal strips 221 being respectively projectively perpendicular to the lower longitudinal strips 211 and juxtapositionally formed in an upper frame 223 superimposed on the lower frame 213, with every two neighboring upper latitudinal strips 221 defining an upper latitudinal capillary slit 222 between the two upper latitudinal strips 221 to be fluidically communicated with an upper capillary thin layer 121 formed in the second cover 12, and each upper latitudinal capillary slit 222 fluidically communicated with each lower longitudinal capillary slit 212 especially shown in FIG. 5 to thereby define a vertical capillary opening 23 through the lower longitudinal capillary slit 212 and the upper latitudinal capillary slit 222 through the two grids 21, 22.

Naturally, the lower grid 21 may also be modified to comprise a plurality of latitudinal strips, while the upper grid 22 be modified to comprise a plurality of longitudinal strips.

The upper and lower grids 22, 21 may be preferably made of heat conductive materials, including: metals, ceramic, carbon fibers, plastic and composite materials, not limited in this invention.

The two grids 22, 21 may be combined by any conventional joining methods. Each grid 22 or 21 may be formed by conventional processes, including: integral forming, casting, molding, or any other mechanical processing methods.

In operation of the present invention, the heat as transferred from the heat source 4 attached to the first cover 11 will vaporize the working fluid as absorbed in the lower capillary thin layer 111. The vapors thus vaporized will ascend upwardly (U) through the vertical capillary openings 23, the lower capillary slits 212 and the upper capillary slits 222 to be absorbed into the upper capillary thin layer 121 in the second cover 12, which is secured with heat sink or heat dissipation device 5 thereon. The vapors will then be cooled and condensed to release heat of condensation, which heat is then dissipated outwardly through the side walls of the casing 1 and by the heat sink or heat dissipation device 5.

The condensate drops of working fluid will then fall (D) to be temporarily accumulated in each accumulating pit (A) defined among the two neighboring upper strips 221 and a lower strip 211 as shown in FIG. 5, as adjacent to each vertical capillary opening 23. By the way, the condensate drops accumulated (or saturated) in each pit A will not retard or collide the uprising vapors (U) during the vaporization cycle of the working fluid. After the ascending vapors reach the upper or second cover 12, the condensate drops as saturated in the pits A will gravitationally descend to return, through the capillary openings 23 and slits 222, 212, towards the lower capillary thin layer 111 in the first cover 11 to absorb vaporization heat for next operation cycle.

By the repeated vaporization and condensation of the working fluid within the vapor chamber 10, the heat from the heat source will be efficiently dissipated to reduce its operating temperature to an allowable level to protect the electronic product for better performance and reliability.

The heat source 4 and the heat sink 5 may also be secured to the other side portions of the casing 1, besides the locations as that shown in FIG. 3.

The present invention is superior to the prior art with the following advantages:

1. The crosslinking capillary lattice 2 comprises a plurality of capillary openings 23 and capillary slits 212, 222 to disperse or distribute the vapor pressure homogeneously in the chamber 10 and enhance the capillary effect for the recycling of vaporization and condensation of the working fluid to rapidly dissipate the heat as transferred from the heat source.
2. The longitudinal grid 21 is projectively perpendicular to and superimposed with the latitudinal grip 22 to form a crosslinking-like structure, thereby enhancing the mechanical strength or structural stability of the lattice as retained in the vapor chamber 10 in the casing.
3. The crosslinking array of the upper latitudinal grid 22 with the lower longitudinal grid 21 may prevent from back pressure when the working fluid is instantly filled into the chamber in the casing to thereby facilitate the vacuum evacuation in the casing and facilitate the filling of working fluid into the casing 1.
4. If the upper and lower grids 22, 21 are made of good heat conductive materials, partial heat may be outwardly dissipated through the grids 21, 22 and the side walls of the casing 1 for helping heat dissipation of the present invention.

The present invention may rapidly "disperse" the heat from one heat spot of the heat source to be a larger heat-dissipation area through a plurality of heat-dissipating paths or orientations, thereby providing an excellent thermal spreader having high efficiency of heat dissipation.

The above-mentioned upper grid 22 and lower grid 21, if being formed as a square shape, may be produced only be a single mold for lowering production cost, since the upper grid may be turned at a right angle to become the lower grid.

Figure 6:
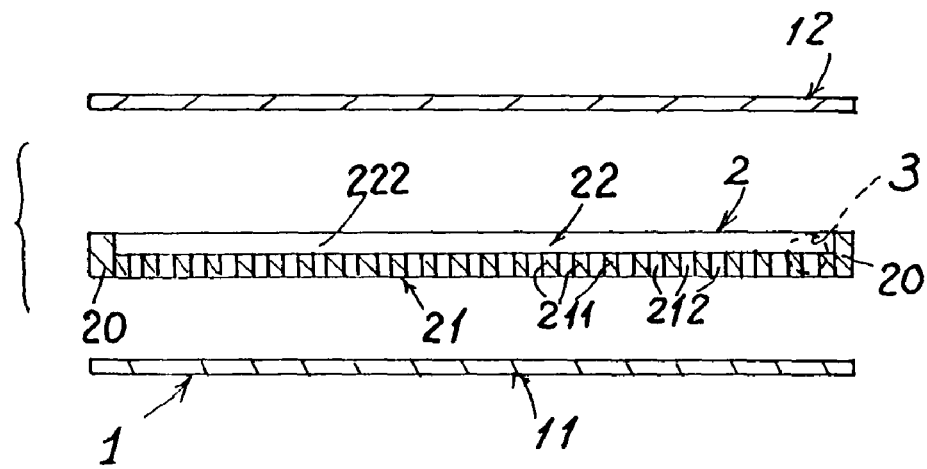
FIG. 6 shows another preferred embodiment of the present invention.

The crosslinking capillary lattice 2 has been modified to be a one-piece structure as shown in FIG. 6 by integrally forming the upper latitudinal grid 22 on an upper portion of the lattice and forming the lower longitudinal grid 21 on a lower portion of the lattice, both grids 22, 21 confined within a frame 20, which is encased by the first cover 11 and the second cover 12 of the casing 1.

Figure 7:
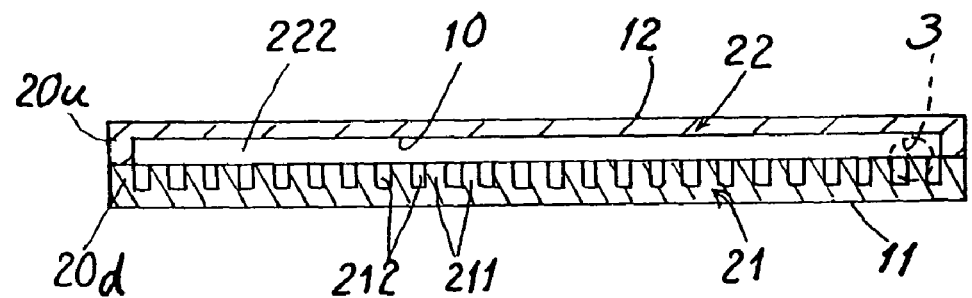
FIG. 7 shows still another preferred embodiment of the present invention.

As shown in FIG. 7, the crosslinking capillary lattice 2 has been modified to integrally form the upper latitudinal grid 22 with an upper frame 20u and integrally form the lower longitudinal grid 21 with a lower frame 20d; and the first cover 11 is integrally formed with the lower longitudinal grid 21, and the second cover 12 is integrally formed with the upper latitudinal grid 22, having the vapor chamber 10 defined among the upper cover 12, the lower cover 11, the upper frame 20u and the lower frame 20d.

Figure 8:
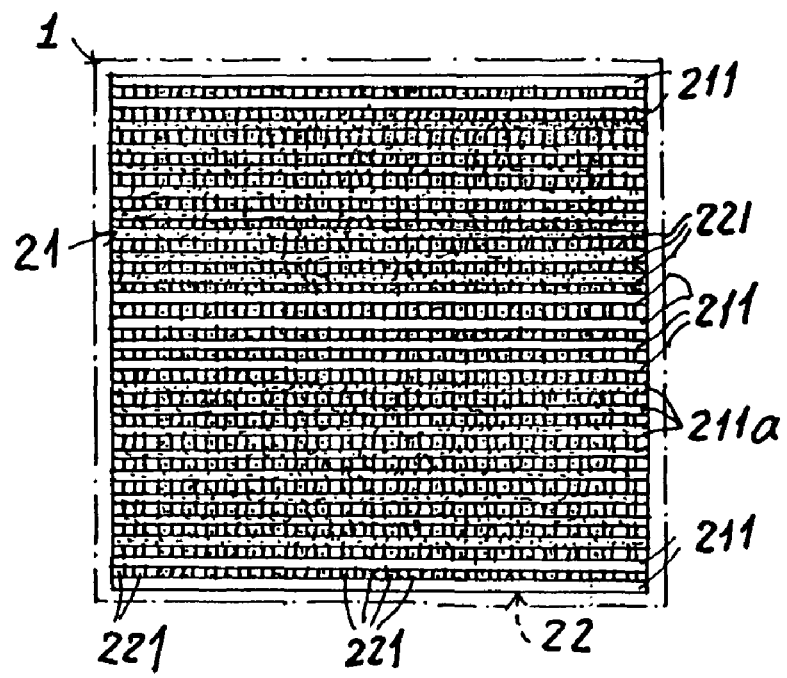
FIG. 8 shows further preferred embodiment of the present invention.
Figure 9:
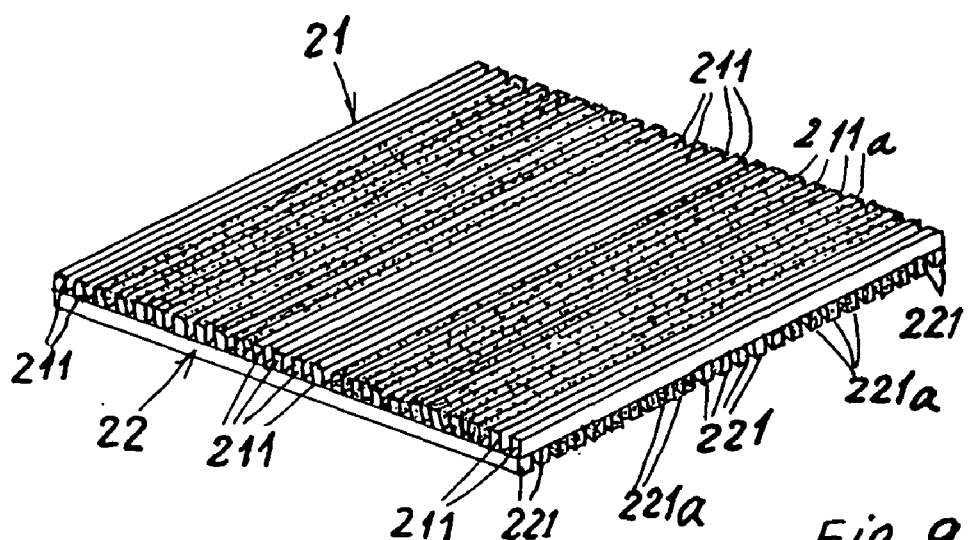
FIG. 9 is a partial perspective view of the embodiment of FIG. 8.

As shown in FIGS. 8 and 9, some strips 211, 221 are made as solid strips, while the other strips 211a, 221a are made as porous or fluid-absorbable strips, whereby the condensed liquid drops of working fluid may be accumulated between two neighboring solid strips 211, 221 due to surface tension of the condensed liquid drops, and the liquid drops will then gravitationally drain, after increasing the weight of the accumulated liquid drops, through the capillary slits respectively defined among neighboring strips 211, 221. During the accumulation of the liquid drops on the solid strips, the vapor as vaporized from the working fluid will ascend through those capillary openings or slits defined among the porous strips 211a, 221a, without colliding with the descending condensed liquid drops as gravitationally drained through the solid strips 221, 211, thereby providing a smooth recycling passage for the working fluid as repeatedly vaporized and condensed. Therefore, the "chamber" confined among the solid strips 211, 221 may be considered as a "compensation chamber" for well compensating any unsmooth fluid convection flow during the vaporization and condensation cycles of the working fluid.

Figure 10:
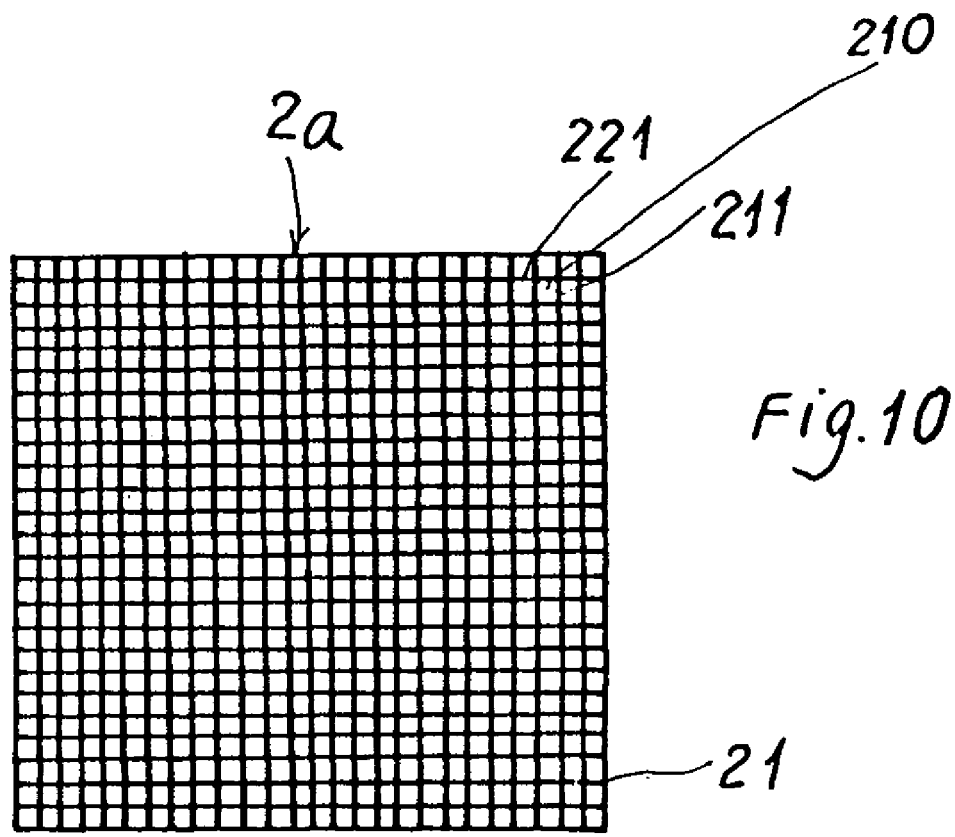
FIG. 10 is a top view of the crosslinking capillary lattice formed as a crosslinking net in accordance with the present invention.
Figure 11:
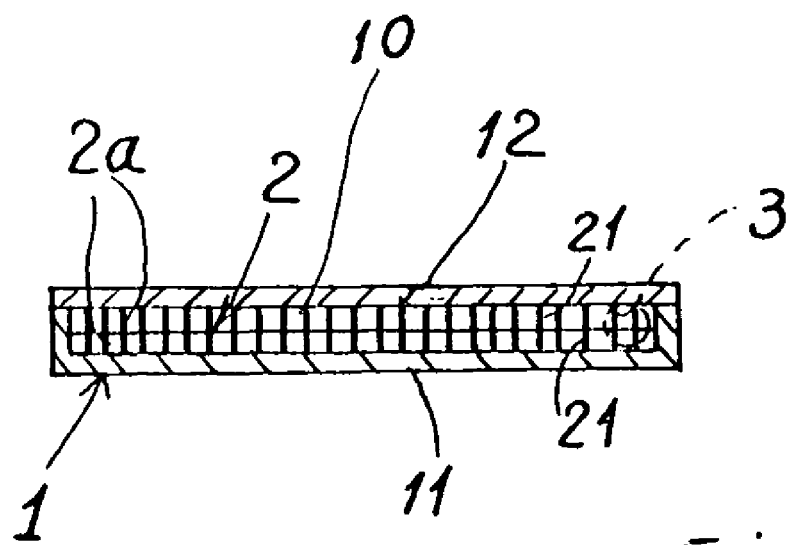
FIG. 11 is a sectional drawing of a still further embodiment of the present invention by embedding the net as shown in FIG. 10 into the casing.

As shown in FIGS. 10 and 11, the aforementioned crosslinking capillary lattice has been modified to be a crosslinking capillary lattice network (or net) 2a having the latitudinal strips 221 perpendicularly interconnected with the longitudinal strips 211 to define a plurality of capillary openings 210 among the latitudinal and longitudinal strips.

The present invention may be further modified without departing from the spirit and scope of the present invention.

We claim:

1. A thermal spreader comprising: a casing having a first side contacted with a heat source and a second side of said casing secured with a heat sink, and having a vapor chamber defined in an interior in the casing; and a crosslinking capillary lattice formed in the casing and occupying the vapor chamber in the casing, whereby upon evacuation to form vacuum in the vapor chamber and filling of a vaporizable working fluid in the vapor chamber, the working fluid will be repeatedly vaporized and condensed through the crosslinking capillary lattice to absorb and remove heat from the first side of the casing and to dissipate heat outwardly from the second side of the casing;

said casing including: a first cover, which is contacted with a heat source; and a second cover combined with the first cover to define the vapor chamber in between the first cover and the second cover for forming said lattice therein; said second cover secured with a heat sink thereto;

said crosslinking capillary lattice including: a lower longitudinal grid closely contacted with the first cover, and an upper latitudinal grid superimposed on the lower longitudinal grid and closely contacted with the second cover; with the two grids occupying the vapor chamber in the casing and respectively contacted with two capillary thin layers respectively formed in the first and second covers;

said lower longitudinal grid, as superimposed under the upper latitudinal grid, including: a plurality of lower longitudinal strips juxtapositionally formed in a lower frame, with every two neighboring lower longitudinal strips defining a lower longitudinal capillary slit between the two lower longitudinal strips to be fluidically communicated with a lower capillary thin layer formed in the first cover;

said upper latitudinal grid including: a plurality of upper latitudinal strips being respectively projectively perpendicular to the lower longitudinal strips and juxtapositionally formed in an upper frame superimposed on the lower frame, with every two neighboring upper latitudinal strips defining an upper latitudinal capillary slit between the two upper latitudinal strips to be fluidically communicated with an upper capillary thin layer formed in the second cover, and each said upper latitudinal capillary slit fluidically communicated with each said lower longitudinal capillary slit to thereby define a vertical capillary opening through the lower longitudinal capillary slit and the upper latitudinal capillary slit through the two grids; and each said grid including some strips made as solid strips, and the other strips made as porous or fluid-absorbable strips.

2. A thermal spreader according to claim 1, wherein each said cover of the first and second covers includes: a capillary thin layer fixed to an inside wall of the cover to be fluidically communicated with the crosslinking capillary lattice in the casing; with said capillary thin layer made of: metal network, sintering film, powder metallurgy layer.

3. A thermal spreader according to claim 1, wherein said crosslinking capillary lattice is a one-piece structure by integrally forming the upper latitudinal grid on an upper portion of the lattice and forming the lower longitudinal grid on a lower portion of the lattice, said lattice confined within a frame, which is encased by the first cover and the second cover of the casing.

4. A thermal spreader according to claim 1, wherein said crosslinking capillary lattice is formed by integrally forming the upper latitudinal grid with an upper frame and integrally forming the lower longitudinal grid with a lower frame; and the first cover integrally formed with the lower longitudinal grid, and the second cover integrally formed with the upper latitudinal grid, having the vapor chamber defined among the upper cover, the lower cover, the upper frame and the lower frame.

5. A thermal spreader comprising: a casing having a first side contacted with a heat source and a second side of said casing secured with a heat sink, and having a vapor chamber defined in an interior in the casing; and a crosslinking capillary lattice formed in the casing and occupying the vapor chamber in the casing, whereby upon evacuation to form vacuum in the vapor chamber and filling of a vaporizable working fluid in the vapor chamber, the working, fluid will be repeatedly vaporized and condensed through the crosslinking capillary lattice to absorb and remove heat from the first side of the casing and to dissipate heat outwardly from the second side of the casing;

said casing including: a first cover, which is contacted with a heat source; and a second cover combined with the first cover to define the vapor chamber in between the first cover and the second cover for forming said lattice therein; said second cover secured with a heat sink thereto;

said lattice including an upper grid integrally formed with a lower grid in a frame, said upper grid having a plurality of upper strips projectively perpendicular to a plurality of lower strips of the lower grid; with every two neighboring strips defining a capillary slit therebetween:

each said grid including partial some strips formed as solid strips and the other strips formed as porous strips.

* * * * *